United States Patent
Baumer et al.

[11] Patent Number: 5,861,766
[45] Date of Patent: Jan. 19, 1999

[54] MULTIMODE FREQUENCY SYNTHESIZER HAVING HIGH LOOP GAIN IN FREQUENCY SEEK MODE

[75] Inventors: Howard Anthony Baumer, Laguna Hills; David Kyong-sik Chung, Newport Beach; Gerald Weslie Shearer, Orange, all of Calif.

[73] Assignee: Western Digital Corporation, Irvine, Calif.

[21] Appl. No.: 844,221

[22] Filed: Apr. 17, 1997

[51] Int. Cl.⁶ .................................................. H03L 7/085
[52] U.S. Cl. .......................... 327/105; 327/107; 327/148; 327/157; 360/60; 360/51; 331/1 A
[58] Field of Search ..................... 327/105, 107, 327/141, 147, 148, 150, 156, 157, 159, 113; 331/1 A, 25; 360/50, 60, 51, 65, 46; 369/48; 375/354, 374; 364/721, 718

[56] References Cited

U.S. PATENT DOCUMENTS

| | | | |
|---|---|---|---|
| 4,494,021 | 1/1985 | Bell et al. | 327/262 |
| 4,639,680 | 1/1987 | Nelson | 327/7 |
| 4,988,960 | 1/1991 | Tomisawa | 332/127 |
| 5,028,887 | 7/1991 | Gilmore | 331/18 |
| 5,036,216 | 7/1991 | Hohmann et al. | 327/157 |
| 5,079,521 | 1/1992 | Gaskell et al. | 331/1 A |
| 5,126,692 | 6/1992 | Shearer et al. | 331/8 |
| 5,136,260 | 8/1992 | Yousefi-Elezei | 331/17 |
| 5,159,705 | 10/1992 | Critchlow et al. | 455/76 |
| 5,424,689 | 6/1995 | Gillig et al. | 331/17 |
| 5,463,504 | 10/1995 | Kumura et al. | 360/65 |
| 5,774,022 | 6/1998 | Griffin et al. | 327/157 |

OTHER PUBLICATIONS

"Phase Lock Loops," Jerry Shearer, Oct. 23, 1991, Western Digital Paper, 34 pages.

"Frequency Synthesizer and Data Synthesizer" Mohammad Sarhang Nejad, Oct. 5, 1995, Western Digital Paper, 62 pages.

*Primary Examiner*—Dinh Le
*Attorney, Agent, or Firm*—Leo J. Young, Esq.; Milad G. Shara, Esq.

[57] ABSTRACT

A frequency synthesizer has multiple modes of operation including a relatively short-duration frequency seek mode and a relatively long-duration normal mode. The synthesizer responds to a reference frequency signal and produces a periodic signal at a frequency that is a rational number times the frequency of the reference frequency signal. The synthesizer comprises a VCO, a feedforward state machine, a feedback state machine, a phase comparator, controllable gain circuitry between the phase comparator and the VCO, and logic circuitry that coordinates the operation of the feedforward and feedback state machines during the seek mode.

26 Claims, 10 Drawing Sheets

MULTIMODE FREQUENCY SYNTHESIZER HAVING HIGH LOOP GAIN IN FREQUENCY SEEK MODE

BACKGROUND OF THE INVENTION

1. Field of the Invention

The present invention relates generally to closed-loop timing circuits and more particularly to a frequency synthesizer for providing a clock in a channel chip for an embedded servo hard disk drive and in similar circuits.

2. Description of Prior Art

Timing circuits are used to generate high frequency periodic signals for a variety of different applications. For example, timing circuits are used in computers to generate a clock (a substantially constant pulse repetition frequency signal) for a microprocessor, a bus, and for various integrated circuits in a video adapter, a disk drive, etc.

Each of certain closed-loop timing circuits responds to a periodic input signal to produce a periodic output signal under control of an error signal determined by comparing the periodic input and output signals. Such closed-loop timing circuits are commonly found in read/write circuitry for a hard disk drive. A contemporary embedded servo hard disk drive typically includes a channel chip which includes multiple closed-loop timing circuits. One such closed-loop timing circuit (referred to herein as a timing recovery circuit) responds to a read signal to produce a read clock for recovering data. U.S. Pat. No. 5,278,702 discloses a timing recovery circuit within a data synchronizer for recovering data. Another such closed-loop timing circuit (referred to herein as a frequency synthesizer) produces a clock used by different circuits in different types of operations. In one type, namely write operations, this clock is used by write circuitry to set the channel rate. In another type, the timing recovery circuit uses this clock as a substitute for the read signal (for example, during a seek in an embedded servo disk drive).

A contemporary hard disk drive utilizes zone banding for data to provide high capacity, and substantial research and development work has been, and continues to be, devoted to developing enabling technology for a zone-banded servo. As for zone banding generally, whether for data or for servo, its advantage resides in providing higher linear bit density recording. In older disk drives that did not employ any zone banding, the data was recorded at substantially the same channel rate for every track on the recording surface. Because the circumference of each track is a function of its radius, and because the same channel rate is used in such older drives, the in such older drives, the linear bit density changes as a fiction of track radius. In a contemporary embedded servo disk drive employing zone banding for data, the channel frequency for data changes from one band to another, with the highest channel frequency being used for the outermost zone band.

A patent application filed Mar. 10, 1997, in the United States Patent and Trademark Office, titled "DISK DRIVE EMPLOYING READ ERROR TOLERANT SYNC MARK DETECTION," in the name of Robert Cloke, and assigned to the assignee of this invention [Docket No. K35A0195/Ser. No. 08/815,352], discloses certain technology applicable to a zone-banded servo. The above-identified application includes a drawing [FIG. 2B] showing a preferred format of data wedges and servo wedges for a zone-banded servo. The disclosure of the above-identified application is hereby incorporated by reference herein.

Although zone banded technology enables substantially higher storage density, it imposes challenges in requiring that certain circuitry in the channel be capable of rapidly changing its clock frequency as the head moves radially from zone band to zone band. These challenges are particularly difficult as to efforts to provide zone-banded servo.

As for the challenges involved for a frequency synthesizer, there will now be described the construction and operation of a representative prior art synthesizer.

With reference to FIG. 1, a typical prior art frequency synthesizer 1 receives a reference frequency signal (REF CLK) 3 as an input and produces a periodic output signal TCLK 5 as an output. Synthesizer 1 includes a feedforward state machine 7 (hereinafter referred to as "N divider 7"), a register 9 for storing a start value for N divider 7, and a closed-loop arrangement including a phase comparator 11, a charge pump 13, a filter 15, a voltage controlled oscillator (VCO) 17, and a feedback state machine 19 hereinafter referred to as "M divider 19." Synthesizer 1 also includes a register 21 for storing a start value for M divider 19.

Registers 9 and 21 are connected to a bus so that each can receive a selected programmed value from an external source such as a programmed microprocessor. These programmed values are repeatedly loaded into N divider 7 and M divider 19 to determine the ratio between the frequency of TCLK 5 and REF CLK 3.

N divider 7 produces an $N_0$ signal and provides it to phase comparator 11. M divider 19 produces an $M_0$ signal and provides it to phase comparator 11. Each of the $N_0$ and $M_0$ signals is a time-varying, binary-valued signal.

As for the structure that performs the functions indicated by the various blocks in FIG. 1, suitable structure is taught in various patents. For example, U.S. Pat. No. 4,494,021 shows a phase comparator in detail in its FIG. 7, and shows a charge pump, filter, and VCO in its FIG. 2.

With reference to FIG. 2, the flow of operation of synthesizer 1 will now be described in terms of a concrete example. The flow of operation involves parallel, independent frequency-division cycles. One such frequency-division cycle (for REF CLK 3 to $N_0$) starts at block 200 with a start value being loaded into a register within N divider 7. The other such frequency-division cycle (for TCLK 5 to $M_0$) starts at block 202 with a start value being loaded into a register within M divider 19. Assume that the register in N divider 7 is an 8-stage register that can be decremented in response to each pulse in REF CLK 3 from any preset value at or below the binary equivalent of the decimal number 255. Assume also that the register in M divider 19 is an 10-stage register that can be decremented in response to each pulse in TCLK 5 from any preset value at or below the binary equivalent of the decimal number 1023. Assume that the start value 40 is repeatedly loaded into the register in N divider 7, and the start value 128 is repeatedly loaded into the register within M divider 19. Assume also that the frequency of REF CLK 3 is 40 megahertz. Under these assumptions, N divider 7 will start a frequency-division cycle at the start value 40, be decremented 40 times, and then define a pulse in its $N_0$ output. This repeating sequence is depicted in FIG. 2 in the loop defined by block 204 ("Decrement N") and the branches from test block 206 ("N=0?"). On the next pulse in REF CLK 3, the start value 40 will be loaded into the register again to start another frequency-division cycle at block 200. In parallel with the foregoing, M divider 19 will start a frequency-division cycle at the start value 128, be decremented 128 times, and then define a pulse in its $M_0$ output. This repeating sequence is depicted in FIG. 2 in the loop defined by block 208 ("Decrement M") and the branches from test block 210 ("M=0?"). On the next pulse in TCLK 5, the start value 128 will be loaded into the register again to start another frequency-division cycle at block 202. Thus, the frequency of the $N_0$ signal will be 1 megahertz (i.e., 40/40 megahertz) and the frequency of TCLK 5 will stabilize at 1 megahertz (i.e., 128/128 megahertz).

In FIG. 2, the operation of phase comparator 11 is depicted in blocks 212, 214, 216, 218, 220, and 222. For most of the parallel frequency-division cycles, neither the U (for pump Up) nor the D (for pump Down) output signals is asserted.

If the frequency-division cycle ending with N=0 occurs before the frequency-division cycle ending with M=0, phase comparator 11 will assert its U output. This is represented in FIG. 2 by blocks 212 ("Pump Down On?") and 216 ("Start Pump Up"). In other words, if the frequency-division cycle ending with M=0 has not completed immediately before block 212, the D output signal will not have been asserted and will remain negated, so the flow will follow the "No" path to block 216 in which the U signal will be asserted. If, on the other hand, the frequency-division cycle ending with M=0 completes immediately before block 212, the D output signal will have been and remain asserted, so the flow will follow the "YES" path to block 214 in which the D signal will be negated.

If the frequency-division cycle ending with M=0 completes before the frequency-division cycle ending with N=0, phase comparator 11 will assert its D output. This is represented in FIG. 2 by blocks 218 ("Pump Up On?") and 222 ("Start Pump Down"). In other words, if the frequency-division cycle ending with N=0 has not completed immediately before block 218, the U output signal will not have been asserted and will remain negated, so the flow will follow the "No" path to block 222 in which the D signal will be asserted. If, on the other hand, the frequency-division cycle ending with N=0 completes immediately before block 218, the U output signal will have been and remain asserted, so the flow will follow the "YES" path to block 220 in which the U signal will be negated.

A problem associated with a prior art frequency synthesizer involves the undesirable amount of time consumed in seeking from one selected frequency to a newly selected frequency and settling at the newly selected frequency. In an embedded-servo disk drive employing zone-banded recording, the frequency synthesizer in the channel chip needs to provide a selected one of a set of frequencies corresponding to a respective one of the zone bands. Whenever a track seek operation crosses a zone-band boundary, the frequency synthesizer receives a set of new start values from a microprocessor and needs to seek and settle its output frequency accordingly. To accomplish zone-banded servo, such frequency seeking and settling will need to be very rapid. As a general rule, any adjustment to the design of a prior art frequency synthesizer directed to reducing the amount of time it requires for frequency seeking and settling tends to make the frequency synthesizer unstable.

An aspect of the above-described problem involves an accumulation of phase error during the parallel, independent frequency-division cycles. With reference to waveforms A and B of FIG. 3, the $N_0$ and $M_0$ inputs to phase comparator 11 are shown for an example of operation immediately after new start values have been transferred into registers 9 and 21. An accumulating phase error, as indicated by 300a, 300b, 300c, 300d, and 300e in waveform B results during the immediately ensuing operation of prior art frequency synthesizer 1. The phase error between the $N_0$ and $M_0$ signals grows with each frequency-division cycle for an undesirably large number of frequency-division cycles. This accumulation of phase error inhibits rapid seeking to and settling at a new frequency for TCLK 5. This accumulation has the effect of adding another pole to the transfer function of the closed loop, whereby the loop is at least second order.

Another aspect of this problem relates to the extent of the accumulation of phase error being such that one of the dividers can start and end two frequency-division cycles before the end of a frequency-division cycle for the other divider.

To illustrate the foregoing point with an example, assume that synthesizer 1 has been operating such that N-divider 7 frequency-divides a 40 MHz REF CLK 3 by 40, and that M-divider 19 frequency-divides a 100 MHz TCLK 5 by 100. Assume at an instance in time referred to herein as time 0, a new start value is transferred to register 21 such that thereafter M-divider 19 will frequency-divide TCLK 5 by 128. Assume for simplicity also that the transfer function from the time error in nanoseconds between the end of the $N_0$ cycle and the end of the $M_0$ cycle) to the change in VCO frequency is a constant (0.0037 Hz per nanoseconds).

Table 1 set forth below lists the following data for this example. One column lists the cycle number for N-divider 7. Another column lists the cycle number for M-divider 19. Another column lists elapsed time from time 0 for specific events, viz., the times at which N-divider 7 ends its frequency-division cycle and the times at which M-divider 19 ends its frequency-division cycle. Another column lists the frequency of VCO 17. Another column lists the error magnitude (the difference in time between the ends of the frequency-division cycles of N-divider 7 and M-divider 19. Another column lists the percentage error between the current and target frequencies of VCO 17.

TABLE 1

| N | M | ELAPSED TIME | VCO FREQ | ERROR | % |
|---|---|---|---|---|---|
| 1 | | END OF N | 1000 | 100.00 | | 22% |
| | 1 END OF M | 1280 | | 280 | |
| 2 | | END OF N | 2000 | 101.04 | | 21% |
| | 2 END OF M | 2547 | | 547 | |
| 3 | | END OF N | 3000 | 103.06 | | 19% |
| | 3 END OF M | 3789 | | 789 | |
| 4 | | END OF N | 4000 | 105.98 | | 17% |
| | 4 END OF M | 4997 | | 997 | |
| 5 | | END OF N | 5000 | 109.67 | | 14% |
| 6 | | END OF N | 6000 | 109.67 | | 14% |
| | 5 END OF M | 6164 | | 1164 | |
| 7 | | END OF N | 7000 | 113.97 | | 11% |
| | 6 END OF M | 7287 | | 287 | |
| 8 | | END OF N | 8000 | 115.03 | | 10% |
| | 7 END OF M | 8400 | | 400 | |
| 9 | | END OF N | 9000 | 116.51 | | 9% |
| | 8 END OF M | 9498 | | 498 | |
| 10 | | END OF N | 10000 | 118.36 | | 8% |
| | 9 END OF M | 10580 | | 580 | |
| 11 | | END OF N | 11000 | 120.50 | | 6% |
| | 10 END OF M | 11642 | | 642 | |
| 12 | | END OF N | 12000 | 122.88 | | 4% |
| | 11 END OF M | 12684 | | 684 | |
| 13 | | END OF N | 13000 | 125.41 | | 2% |
| | 12 END OF M | 13704 | | 704 | |
| 14 | | END OF N | 14000 | 128.01 | | 0% |
| | 13 END OF M | 14704 | | 704 | |
| 15 | | END OF N | 15000 | 130.62 | | -2% |
| | 14 END OF M | 15684 | | 684 | |
| 16 | | END OF N | 16000 | 133.15 | | -4% |
| | 15 END OF M | 16646 | | 646 | |
| 17 | | END OF N | 17000 | 135.54 | | -6% |
| | 16 END OF M | 17590 | | 590 | |

As the first row of Table 1 indicates, at the end of the first frequency-division cycle of N-divider 7, VCO 17 continues operating at 100 MHz which constitutes an initial percentage error of 22%, measured against the target frequency of 128 MHz. Whereas the first frequency-division cycle of N-divider 7 ends after a total elapsed time of 1000 nanoseconds, the first frequency-division cycle of M-divider 19 ends after a total elapsed time of 1280 nanoseconds. The first measured error magnitude is 280 nanoseconds. Based on the assumed transfer function VCO 17 then operates at a higher frequency of 101.04 MHz. The error magnitude accumulates cycle to cycle from 280 nanoseconds to 997 nanoseconds by the end to the fourth frequency-division cycle for M-divider 19. At this stage of operation, the error magnitude has accumulated to such an extent that N-divider 7 ends both its fifth and sixth frequency division cycles before the end of the fifth frequency-division cycle of M-divider 21. Throughout this time, the percentage error remains at 14%. As indicated by the rows at the bottom of Table 1, synthesizer 1 can "overshoot" the target frequency and then begin to "hunt" a steady state value.

In view of the foregoing, it is desirable to provide a frequency synthesizer that more rapidly completes a seek and settle operation in shifting its output frequency from one selected value to another.

SUMMARY OF THE INVENTION

This invention can be regarded as a frequency synthesizer that is responsive to a reference frequency signal and has multiple modes of operation. These multiple modes of operation include a relatively short-duration frequency seek mode and a relatively long-duration normal mode. The frequency synthesizer comprises a signal-controlled oscillator, a feedforward state machine, a feedback state machine, a phase comparator, and, importantly, controllable gain control means.

The feedforward state machine includes a first register that is settable to a first start state and that is responsive to the reference frequency signal to define a counting cycle by counting from the first start state to a first end state. The signal-controlled oscillator provides a periodic output signal. The feedback state machine includes a second register that is settable to a second start state and that is responsive to the periodic output signal to define a counting cycle by counting from the second start state to a second end state.

The phase comparator and the controllable gain control means are coupled between the phase comparator and the signal controlled oscillator.

According to another important feature, the frequency synthesizer includes logic circuitry including means for producing a mode indicating signal that indicates whether the frequency synthesizer is operating in the seek mode or in the normal mode.

The feedforward state machine includes means responsive to the state of the first register for providing a first time-varying, binary-valued signal to the phase comparator. The feedback state machine including means responsive to the state of the second register for providing a second time-varying, binary-valued signal to the phase comparator. The controllable gain control means provides a control signal to the signal-controlled oscillator to control the frequency of the periodic output signal.

The feedforward and feedback state machines define counting cycles independently of each other in the normal mode.

The logic circuitry also includes means for controlling the controllable gain control means to cause the frequency synthesizer to have higher loop gain in the seek mode than in the normal mode. The logic circuitry also includes means for repeatedly coordinating the counting cycles of the feedforward and the feedback state machines for a plurality of counting cycles during the seek mode to cause the first and second registers repeatedly to begin counting from the first and second start states substantially simultaneously.

This invention can also be regarded as an integrated circuit channel chip for an embedded-servo disk drive that includes a microprocessor to supervise operations including writing and reading in accordance with a zone-banded format, the integrated circuit including a frequency synthesizer, a bus, and first and second registers for receiving programmed first and second start values from the microprocessor, the frequency synthesizer being responsive to a reference frequency signal and having multiple modes of operation including a relatively short-duration frequency seek mode and a relatively long-duration normal mode. A frequency synthesizer having structure for completing frequency seek and settle in a relatively short duration is highly advantageous in the context of an integrated circuit channel chip.

The foregoing and other novel and advantageous features of this invention are described in detail below and recited in the appended claims.

DETAILED DESCRIPTION OF THE PREFERRED EMBODIMENT

Figure 4:
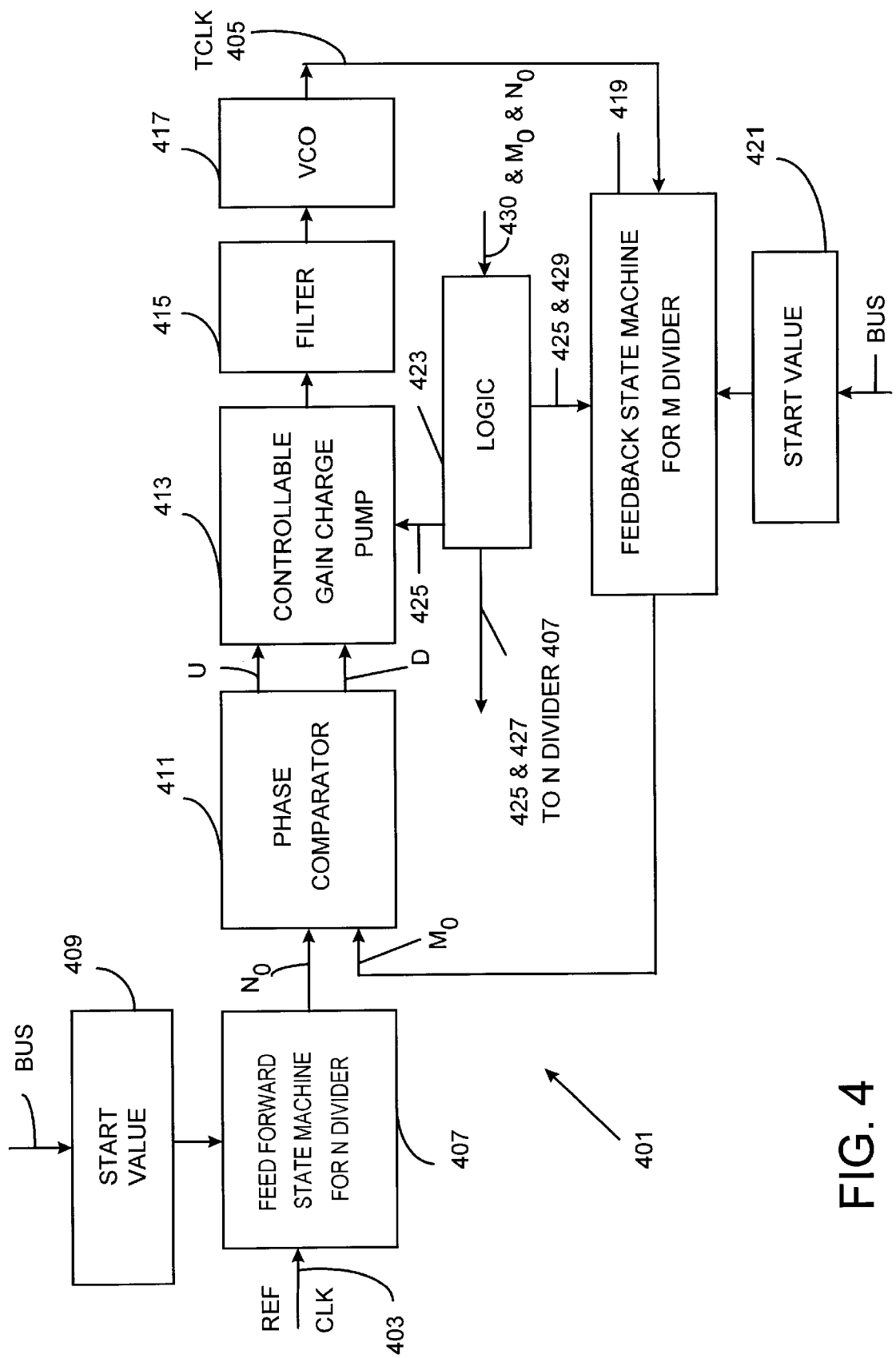
FIG. 4 is a block diagram generally showing a multimode frequency synthesizer embodying this invention.

With reference to FIG. 4, a multimode frequency synthesizer 401 embodying this invention receives a reference frequency signal (REF CLK) 403 as an input and produces a periodic output signal TCLK 405 as an output. Multimode synthesizer 401 includes a feed-forward state machine 407 (hereinafter referred to as "N divider 407"), a register 409 for storing a start value for N divider 407, and a closed-loop arrangement including a phase comparator 411, a controllable-gain charge pump 413, a filter 415, a voltage controlled oscillator (VCO) 417, and a feedback state machine 419 (hereinafter referred to as M divider 419). Multimode synthesizer 401 also includes a register 421 for storing a start value for M divider 419. Multimode synthesizer 401 also includes logic circuitry 423 that is shown in more detail in FIG. 5.

Registers 409 and 421 are connected to a bus so that each can receive a selected programmed value from an external source such as a programmed microprocessor. One programmed value is repeatedly copied from register 409 and loaded into N-register 407 to provide a first start value or start state. The other programmed value is repeatedly copied from register 421 and loaded into M-register 419 to provide a second start value or start state. These start states determine the ratio between the frequency of TCLK 405 and REF CLK 403.

Figure 5:
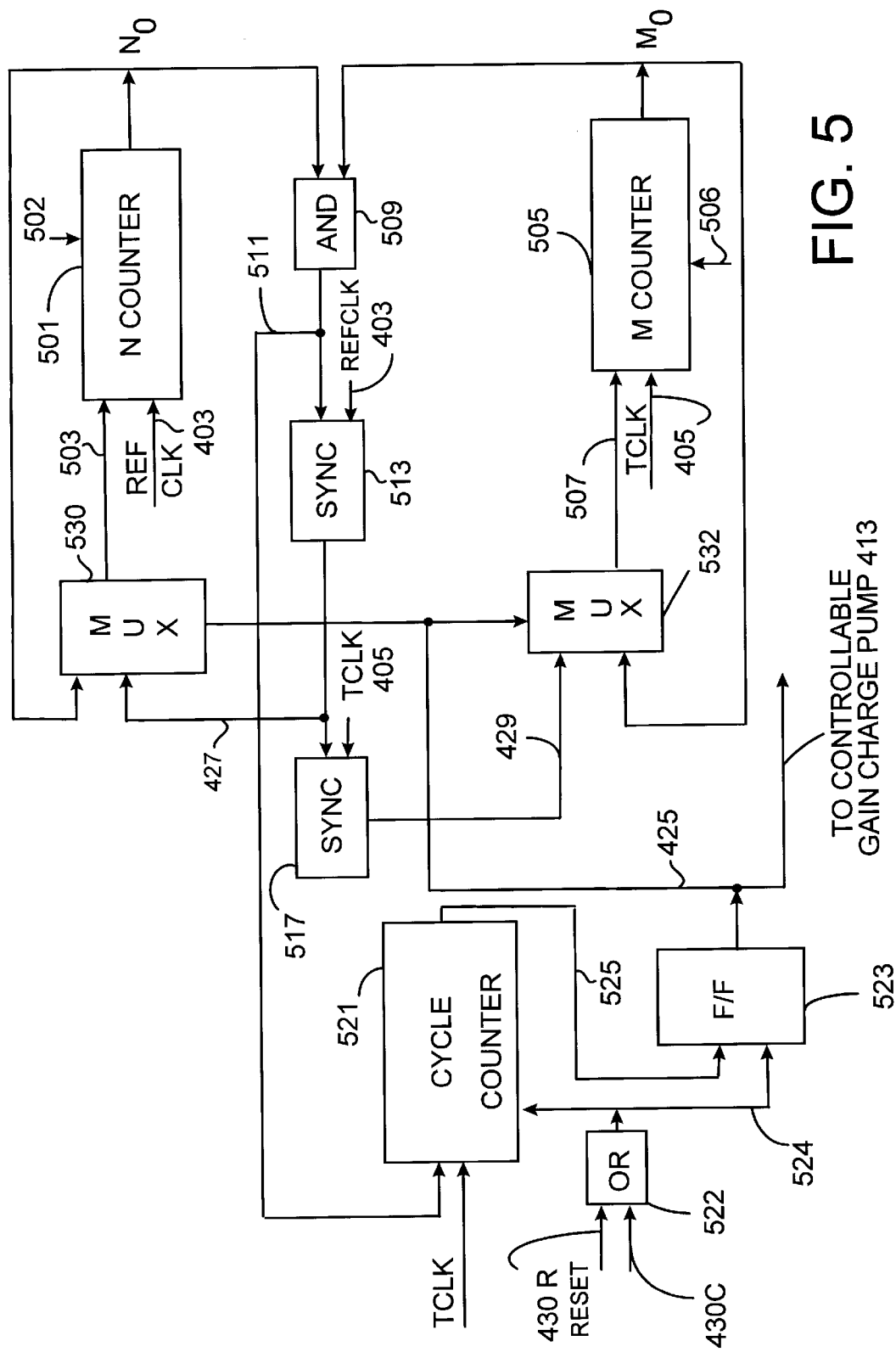
FIG. 5 is a block diagram showing further detail of the multimode frequency synthesizer of FIG. 4.

Logic circuitry 423 also operates under control of the external microprocessor. To this end, logic circuitry 423 has inputs for receiving certain control signals collectively identified in FIG. 4 at 430. Control signals 430 are derived from microprocessor commands and include, as shown in FIG. 5, a reset signal 430R and a change-mode control signal 430C. Each of these control signals is suitably a binary-valued control signal.

Logic circuitry 423 provides for controlling controllable gain charge pump via a seek mode active signal 425. The closed loop defined by phase comparator 411, controllable gain charge pump 413, filter 415, VCO 417, and M-divider 417 has a property referred to as "loop gain." In the seek mode, under control of seek mode active signal 425, the closed loop has higher loop gain than in the normal mode.

Logic circuitry 423 also provides for repeatedly coordinating the counting cycles of N divider 407 and M-divider 419 during the seek mode (while seek mode active signal 425 is asserted). To this end, logic circuitry has inputs for receiving the $N_O$ and $M_O$ signals, and provides a control signal 427 to N divider 407 and a control signal 429 to M-divider 419. Through these signals, logic circuitry 423 causes N-divider 407 and M-divider 421 repeatedly (for a plurality of counting cycles) to begin counting from the first and second start states substantially simultaneously.

With reference to FIG. 5, a counter 501 that is part of N divider 407 has a plurality of states including an N-start state and an N-end state. Suitably, counter 501 counts down from the start state to an end state corresponding to decimal zero to define a counting cycle. Counter 501 has a data input 502 for receiving a start value from register 409, a control input for receiving a load-enable signal 503, and a clock input for receiving REF CLK 403. Counter 501 provides an $N_O$ signal which is a time-varying, binary-valued signal that is asserted only while counter 501 is in its N-end state. A counter 505 that is part of M divider 419 has a plurality of states including an M-start state and an M-end state. Suitably, counter 505 counts down from the start state to an end state corresponding to decimal zero to define a counting cycle. Counter 505 has a data input 506 for receiving a start value from register 421, a control input for receiving a load-enable signal 507, and a clock input for receiving TCLK 405. Counter 505 provides an $M_O$ signal which is a time-varying, binary-valued signal that is asserted only while counter 505 is in its M-end state.

An AND gate 509 is part of logic circuitry 423 and responds to both the $N_O$ signal and the $M_O$ signal and provides an Enable signal 511 Logic circuitry 423 also includes a synchronization flip flop arrangement shown as SYNC 513 in FIG. 5. SYNC 513 also responds to REF CLK 403, and produces control signal 427 that is synchronized to REF CLK 403. Logic circuitry 423 also includes a synchronization flip flop arrangement shown as SYNC 517 in FIG. 5. SYNC 517 also responds to TCLK 405, and produces control signal 429 that is synchronized to TCLK 405.

Logic circuitry 423 also includes counting means for defining the duration of the seek mode. Preferably, the counting means includes a cycle counter 521, an OR gate 522, and a mode-state flip flop 523. OR gate 522 responds to reset signal 430R and to change-mode control signal 430C and produces a control signal 524 that resets cycle counter 521 and sets flip flop 523. Cycle counter 521 is clocked by TCLK signal 405 and produces a seek mode complete signal 525 that is asserted at the end of each interval that multimode synthesizer operates in the seek and settle mode. That is, after being reset, cycle counter 521 counts a predetermined number of consecutive counts (one for each pulse in enable signal 511), then asserts seek mode complete signal 525. After cycle counter 521 has been reset and until it counts to the predetermined count (k), it does not assert seek mode complete signal 525. A suitable value for the predetermined count k is in the range between and including 6 to 8. Flip flop 523 is set when control signal 524 is asserted and is reset when seek mode complete signal 525 is asserted. A suitable alternative implementation of the counting means includes an interval counter that is repeatedly initialized and then counts clock pulses during the interval between the earlier to end and the later to end of the two frequency-division cycles. When the count in the interval counter is sufficiently low, the seek mode complete signal is asserted.

Flip flop 523 produces seek mode active signal 425 that is asserted throughout the interval of operation in the seek and settle mode. Seek mode active signal 425 provides control for a multiplexor (MUX) 530 and for a multiplexor (MUX 532. MUX 530 propagates either the $N_O$ signal or signal 427 to provide signal 503 to counter 501. MUX 532 propagates either the $M_O$ signal or signal 429 to provide signal 507 to counter 505.

Figure 6:
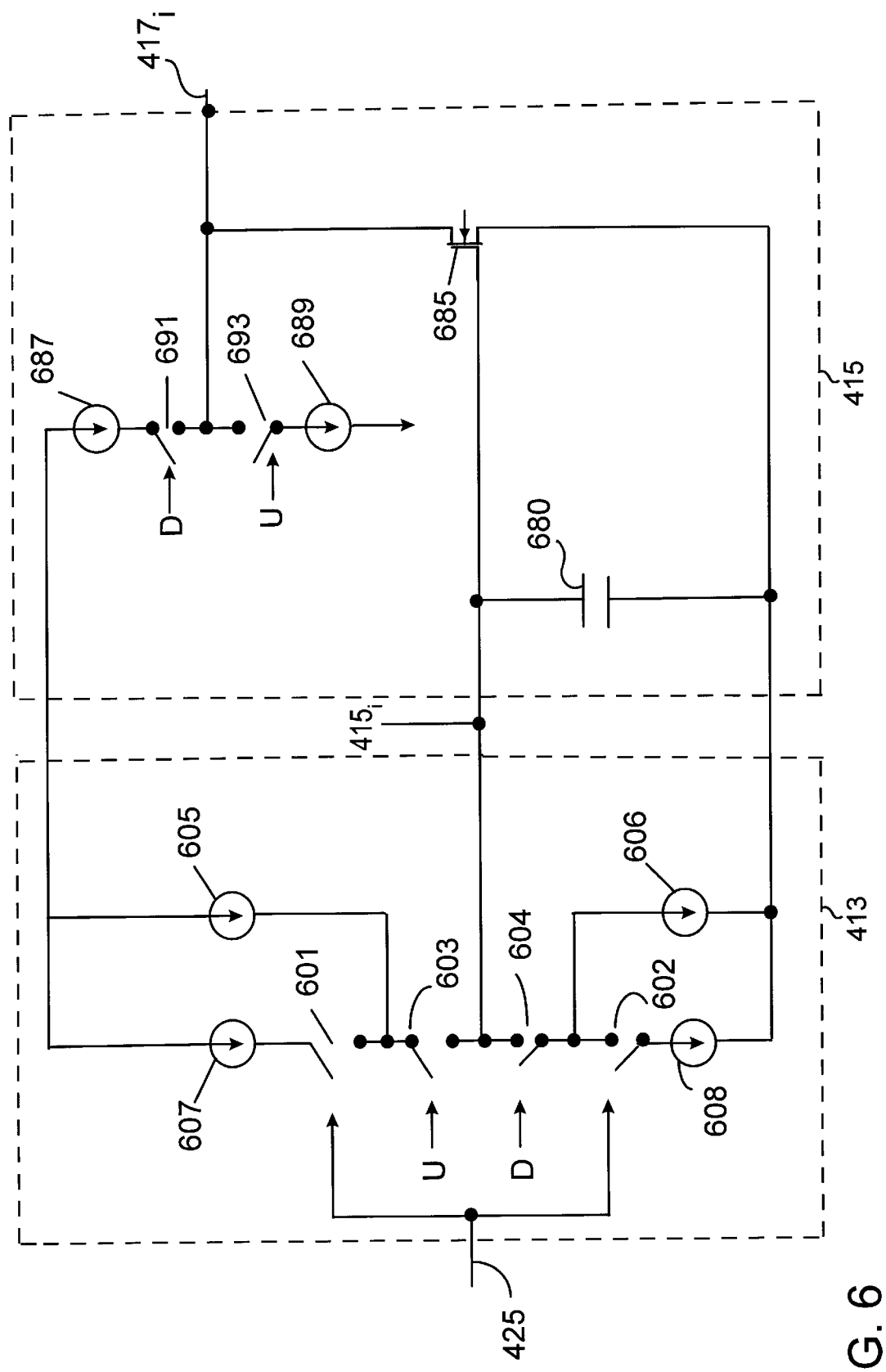
FIG. 6 is a block and schematic diagram of suitable circuitry for incorporation in the multimode frequency synthesizer of FIG. 4 to respond to the output of the phase comparator with different gain depending upon the mode of operation of the frequency synthesizer.

With reference to FIG. 6, variable gain charge pump 413 includes a first pair of CMOS switches 601 and 602, a second pair of CMOS switches 603 and 604, a first pair of current sources 605 and 606, and a second pair of current sources 607 and 608. Each of CMOS switches 601 and 602 is controlled by seek mode active signal 425. CMOS switch 603 is controlled by the U output signal of phase comparator 411. CMOS switch 604 is controlled by the D output signal of phase comparator 411. CMOS switch 603 and CMOS switch 604 are connected in series with CMOS switch 601 and CMOS switch 602, and are connected to input 415i of filter 415.

During normal or default mode, seek mode active signal 425 is not asserted and CMOS switches 601 and 602 are open. As indicated in FIG. 6, only current sources 605 and 606 can flow through either CMOS switch 603 or CMOS switch 604 to input 415i. During seek and settle mode, seek mode active signal 425 is asserted and CMOS switches 601 and 602 are closed. During this mode, as indicated in FIG. 6, both current sources 605 and 607 can flow through CMOS switch 603 to input 415i., and both current sources 606 and 608 can flow through CMOS switch 604 to input 415i. In other words, variable gain charge pump 413 has higher gain during seek and settle mode than in normal or default mode.

As also shown in FIG. 6, filter 415 includes a capacitor 680 and an FET 685 connected between capacitor 680 and an input 417*i* of VCO 417. Filter 415 also includes current sources 687 and 689, and CMOS switches 691 and 693. CMOS switch 691 is controlled by the D output signal of phase comparator 411. CMOS switch 693 is controlled by the U output signal of phase comparator 411.

Figure 7:
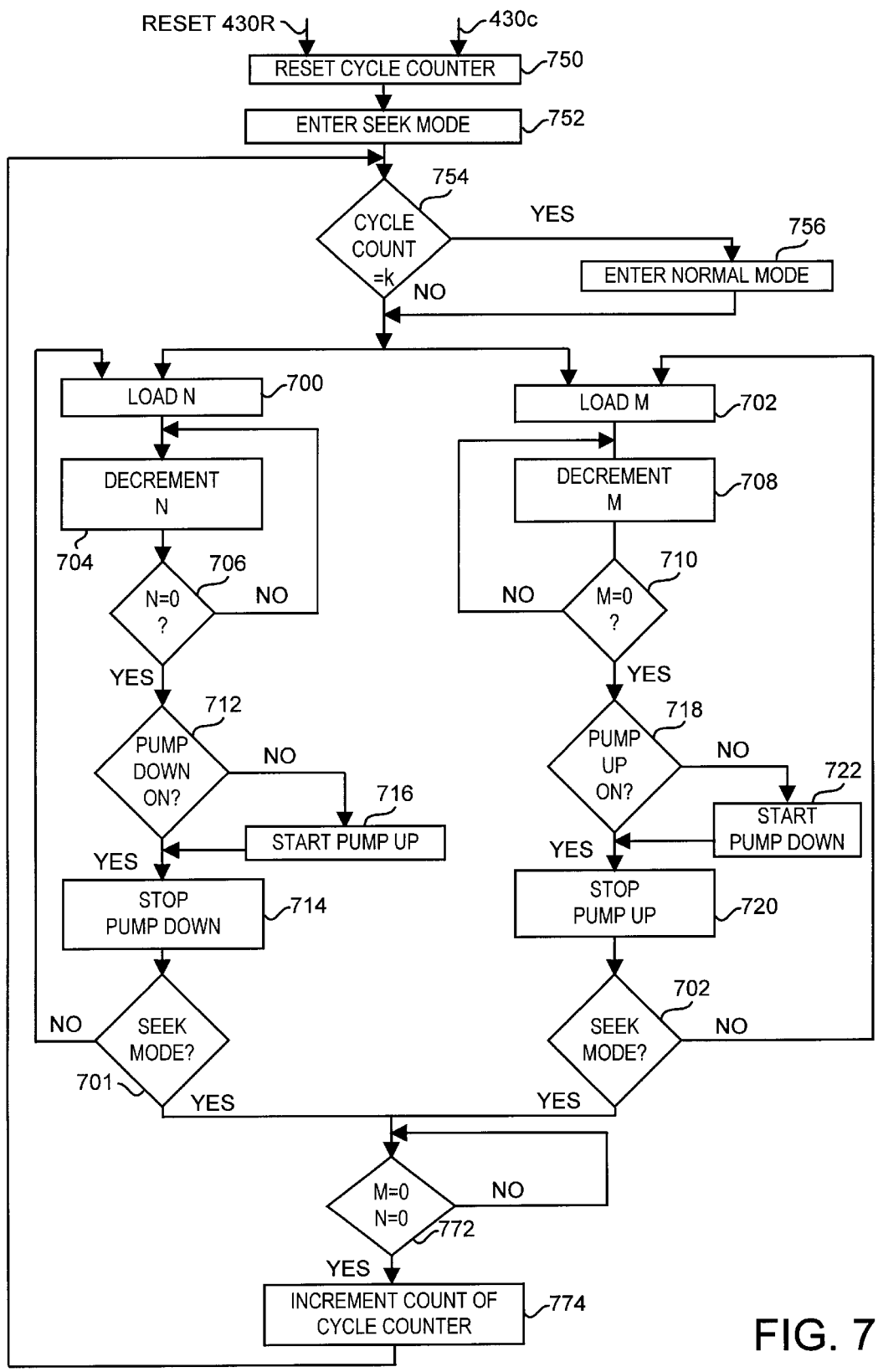
FIG. 7 is a flow chart showing the operation of the multimode frequency synthesizer of FIG. 4.

With reference to FIG. 7, the flow of operation of multimode synthesizer 401 will now be described in terms of a concrete example. The flow of operation involves parallel frequency-division cycles that, during the normal or default mode of operation, are independent of each other (as described above for prior art synthesizer 1) but, significantly, are coordinated during the seek and settle mode of operation. One such frequency-division cycle (for REF CLK 403 to $N_0$) starts at block 700 with a start value being loaded into N counter 501, and proceeds through a loop involving a test block 701. The other such frequency-division cycle (for TCLK 405 to $M_0$) starts at block 702 with a start value being loaded into M counter 505, and proceeds through a loop involving a test block 703. Assume that N counter 502 is an 8-stage register that can be decremented in response to each pulse in REF CLK 403 from any preset value at or below the binary equivalent of the decimal number 255. Assume also that M counter 505 is an 10-stage register that can be decremented in response to each pulse in TCLK 405 from any preset value at or below the binary equivalent of the decimal number 1023. Assume that the start value 40 is repeatedly loaded into N counter 501, and the start value 128 is repeatedly loaded into M counter 505. Assume also that the frequency of REF CLK 403 is 40 megahertz. Under these assumptions, N counter 501 will start a frequency-division cycle at the start value 40, be decremented 40 times, and then define a pulse in its $N_0$ output. This repeating sequence is depicted in FIG. 7 in the loop defined by block 704 ("Decrement N") and the branches from test block 706 ("N=0?").

In normal or default mode, on the next pulse in REF CLK 403, the start value 40 will be loaded into N counter 501 again to start immediately another frequency-division cycle at block 700. In parallel with the foregoing, M counter 505 will start a frequency-division cycle at the start value 128, be decremented 128 times, and then define a pulse in its $M_0$ output. This repeating sequence is depicted in FIG. 7 in the loop defined by block 708 ("Decrement M") and the branches from test block 710 ("M=0?"). In normal or default mode, on the next pulse in TCLK 405, the start value 128 will be loaded into counter 505 again to start immediately another frequency-division cycle at block 702. Thus, the frequency of the $N_0$ signal will be 1 megahertz (i.e., 40/40 megahertz) and the frequency of TCLK 405 will stabilize at 1 megahertz (i.e., 128/128 megahertz).

In FIG. 7, the operation of phase comparator 411 is depicted in blocks 712, 714, 716, 718, 720, and 722. For most of the parallel frequency-division cycles, neither the U (for pump Up) nor the D (for pump Down) output signals is asserted.

If the frequency-division cycle ending with N=0 completes before the frequency-division cycle ending with M=0, phase comparator 411 will assert its U output. This is represented in FIG. 7 by blocks 712 ("Pump Down On?") and 716 ("Start Pump Up"). In other words, if the frequency-division cycle ending with M=0 has not completed immediately before block 712, the D output signal will not have been asserted and will remain negated, so the flow will follow the "NO" path to block 716 in which the U signal will be asserted. If, on the other hand, the frequency-division cycle ending with M=0 completes immediately before block 712, the D output signal will have been and remain asserted, so the flow will follow the "YES" path to block 714 in which the D signal will be negated.

If the frequency-division cycle ending with M=0 completes before the frequency-division cycle ending with N=0, phase comparator 411 will assert its D output. This is represented in FIG. 7 by blocks 718 ("Pump Up On?") and 722 ("Start Pump Down"). In other words, if the frequency-division cycle ending with N=0 has not completed immediately before block 718, the U output signal will not have been asserted and will remain negated, so the flow will follow the "NO" path to block 722 in which the D signal will be asserted. If, on the other hand, the frequency-division cycle ending with N=0 completes immediately before block 718, the U output signal will have been and remain asserted, so the flow will follow the "YES" path to block 720 in which the U signal will be negated.

Figure 1:
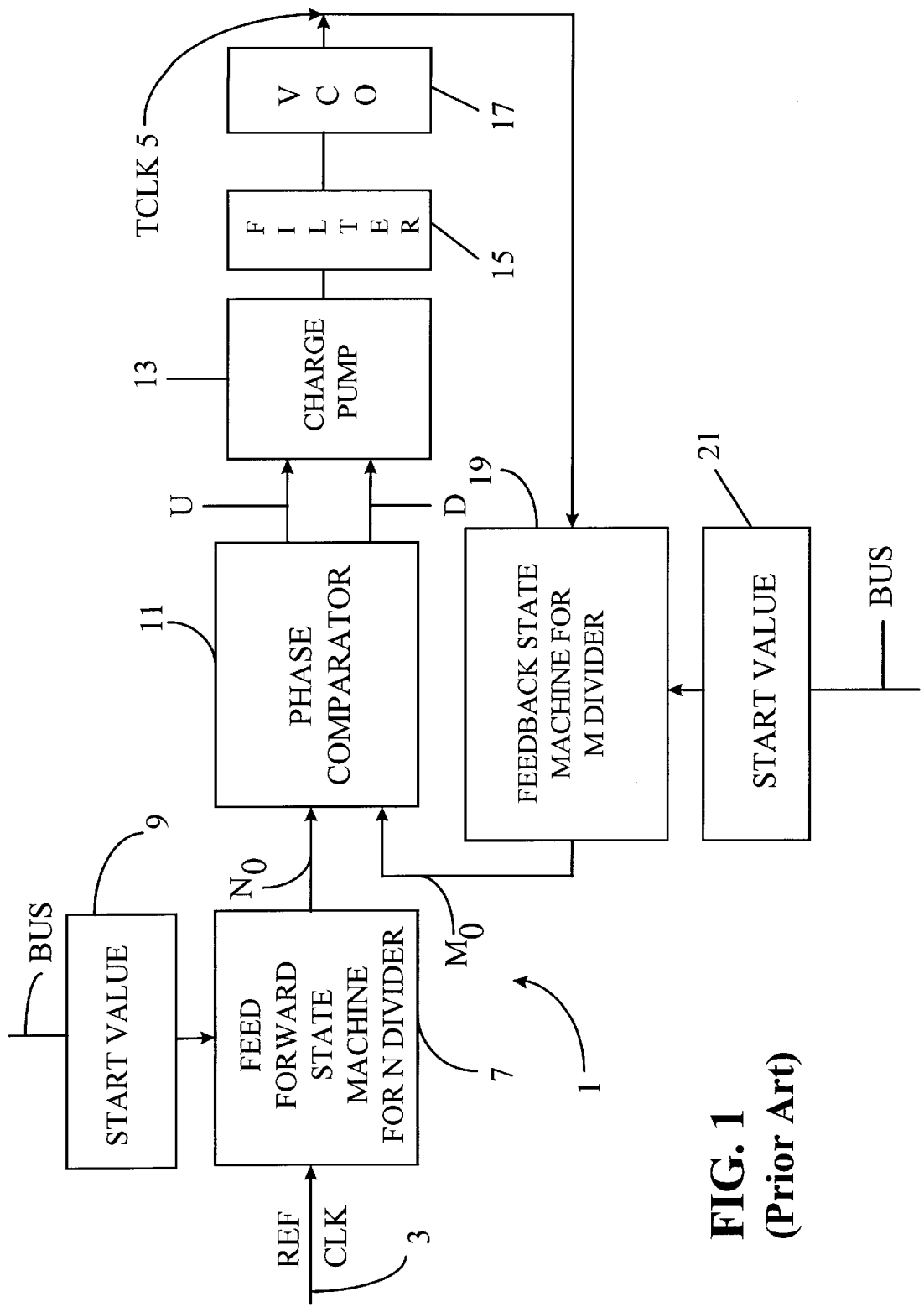
FIG. 1 is a general block diagram showing a typical prior art frequency synthesizer.
Figure 2:
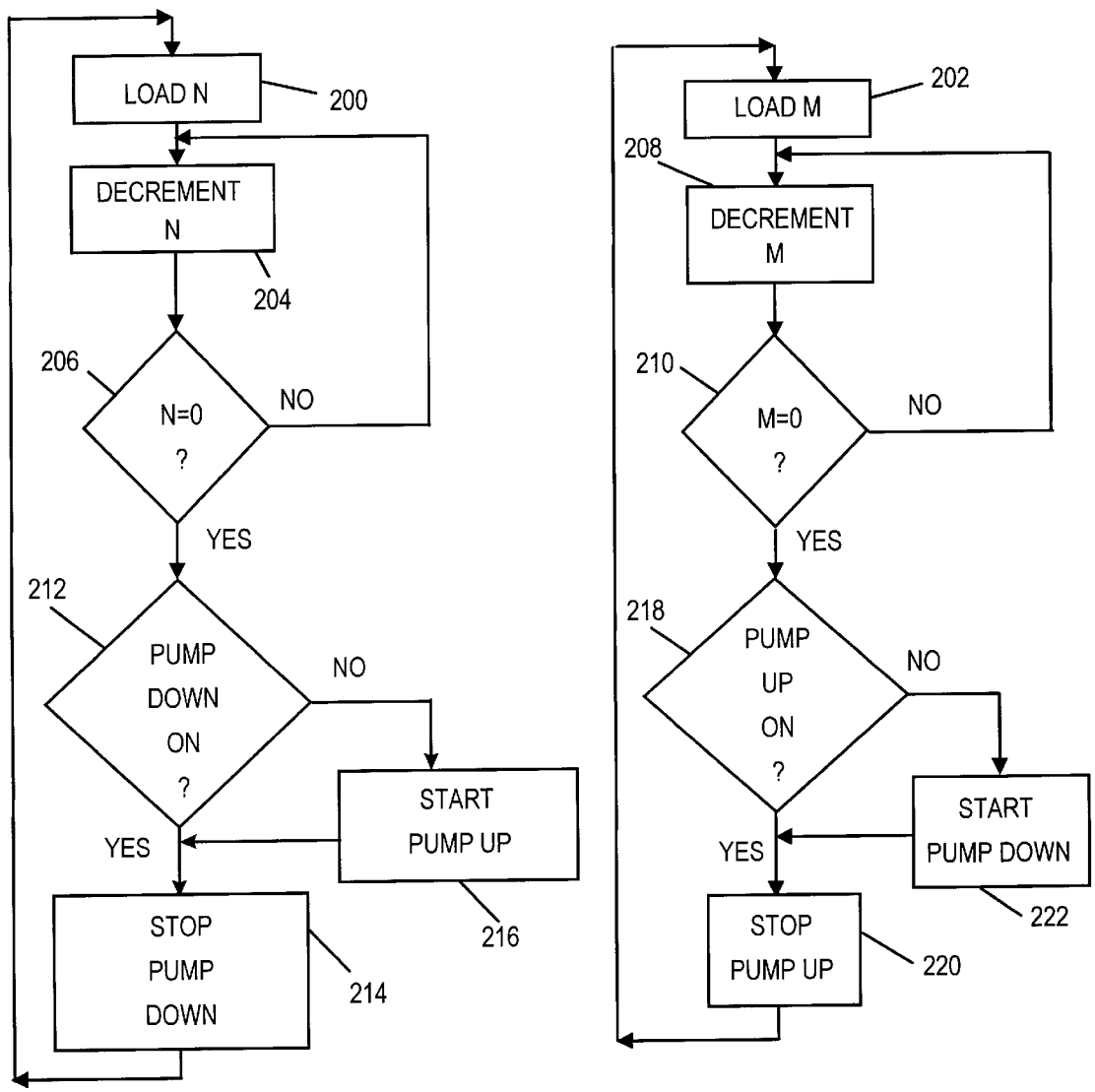
FIG. 2 is a flow chart showing the operation of the prior art frequency synthesizer of FIG. 1.
Figure 3:
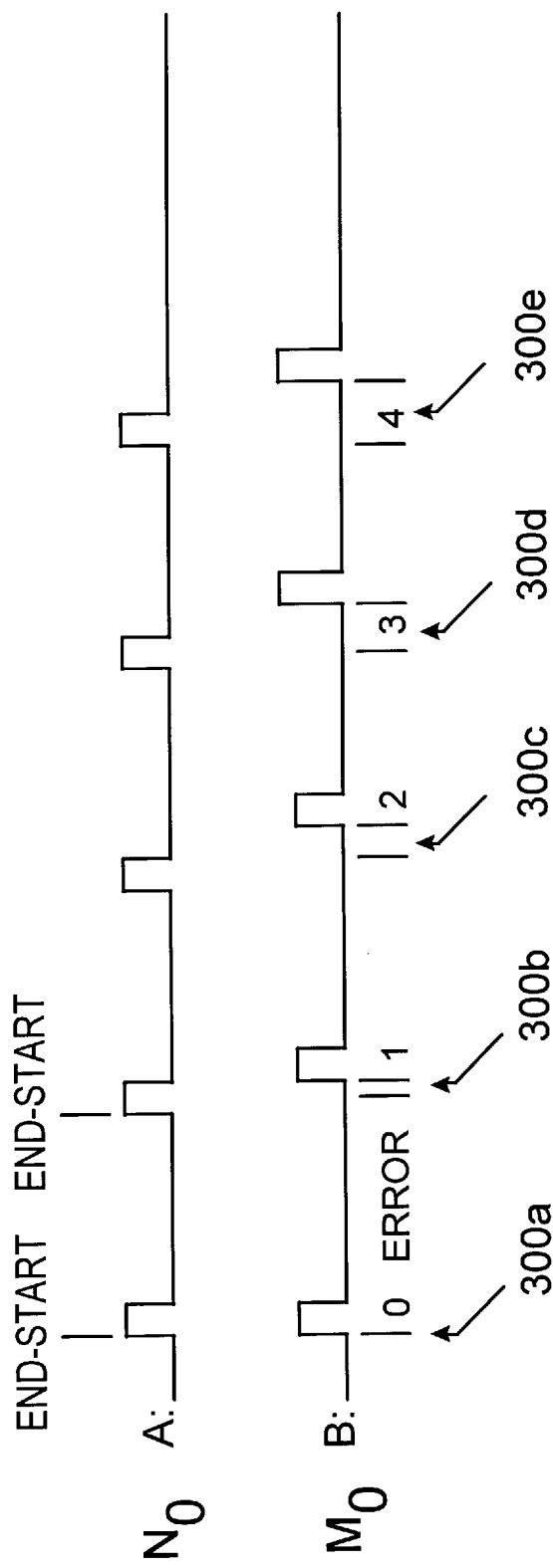
FIG. 3 is a group of two waveforms or timing diagrams showing how phase error accumulates during an operation in which the prior art frequency synthesizer of FIG. 1 is seeking to a newly selected frequency.

Significant differences between the flow of operations depicted in FIG. 7 and in FIG. 2 reside in the multiple modes of FIG. 7 and the coordination of parallel operations involved in FIG. 7. The overall flow of FIG. 7 begins in block 750 whenever reset signal (430R) or change-mode control signal 430C is asserted. Typically, reset signal 430R is asserted at "power on" (when the power supply is turned on). Typically, change-mode control signal 430C is asserted each time a track seek involves a zone band crossing. In either case, as indicated in block 750, cycle counter 521 is reset, and as indicted in a block 752, multimode synthesizer 401 enters its seek and settle mode (flip flop 523 is set and it asserts seek mode active signal 425).

In FIG. 7, the next block is 754 which depicts a test to determine whether to exit the seek and settle mode; more particularly, this test involves determining whether the count in cycle counter 521 has reached a predetermined count (k). If it has, the flow branches to block 756 which involves entering the normal mode (resetting flip flop 523 so that seek mode active signal 425 is negated).

Until such time as the step of block 756 are performed, multimode synthesizer 401 remains in the seek and settle mode and the operations depicted at the bottom of the flow chart of FIG. 7 are affected. In particular, each of blocks 701 and 703 depicts a test to determine whether seek mode is active. If it is not, the flow proceeds immediately to start parallel, independent operations starting in blocks 700 and 702. If seek mode is active, the flow proceeds to block 772.

In accordance with a significant feature, block 772 depicts a test to determine whether both frequency-division cycles have been completed; that is, that $N_0$ and $M_0$ are asserted such that AND gate 509 is asserting enable signal 511. If so, the count in cycle counter 521 is incremented as depicted in block 774, and then the flow returns to re-enter block 754. Thus, while operating in the seek and settle mode, the start of the second, and the start of each of the following parallel frequency-division cycles is deferred until the completion of both preceding frequency-division cycles. The means for coordinating this deferral includes logic circuitry 423 and its connection to both N divider 409 and M divider 421. In particular, as shown in FIG. 5, seek mode active signal 425 causes MUX 530 to propagate signal 427 to N counter 502, and causes MUX 532 to propagate signal 429 to M counter 505. Each of signals 514 and 429 is a synchronized signal asserted after the completion of both parallel frequency-division cycles.

Figure 8:
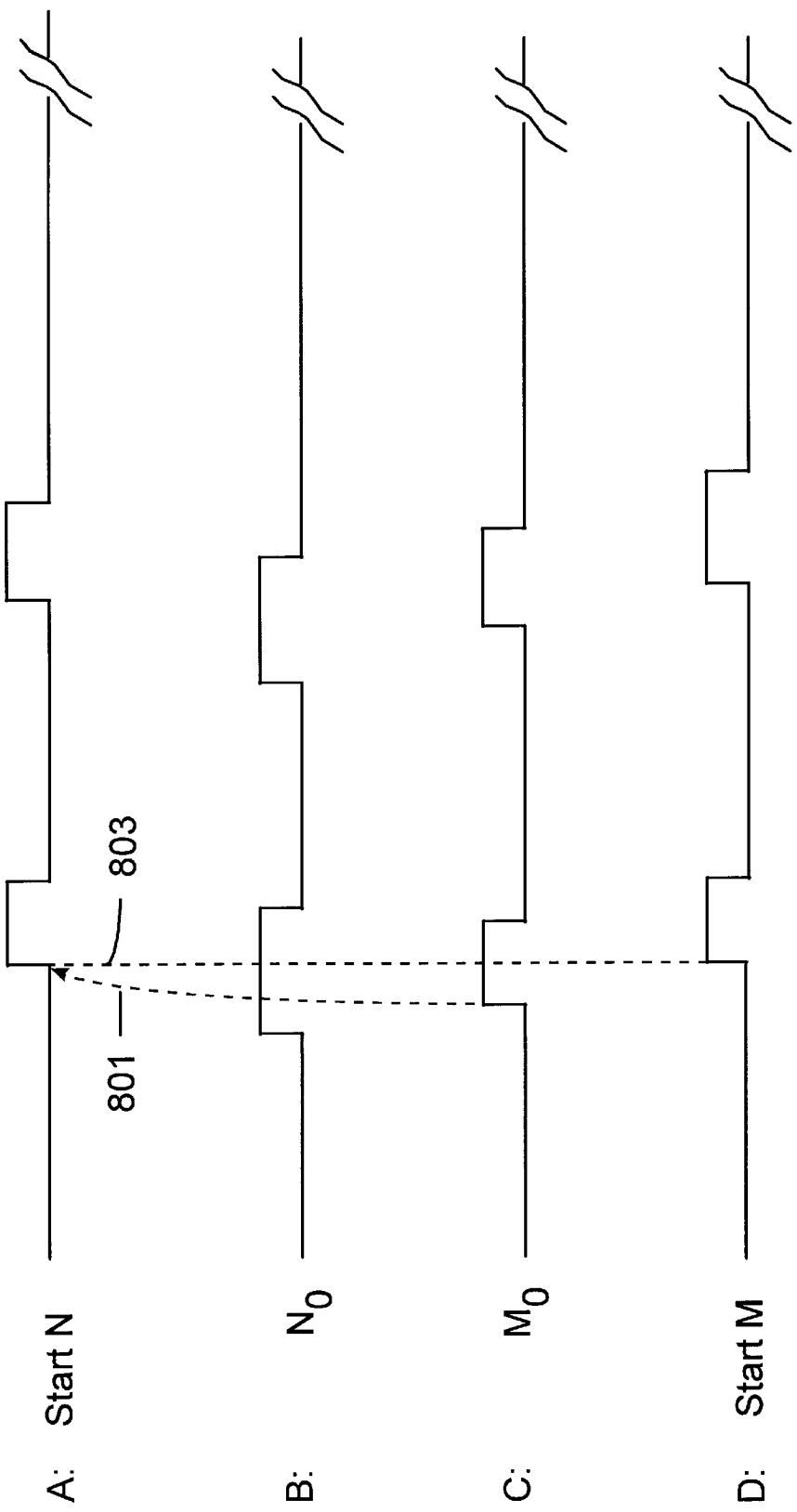
FIG. 8 is a group of four waveforms or timing diagrams showing that the coordination of the start of each frequency-division cycle in the multimode frequency synthesizer of FIG. 4 while it operates in its seek and settle mode.

With reference to FIG. 8, waveforms for certain signals (simplified for ease of understanding) show features of operation of synthesizer 401 during a seek mode in which N-divider 407 ends its frequency-division cycle before M-divider 419 ends its frequency-division cycle. In this case, the leading edge of a pulse in the No signal (waveform B) precedes the leading edge of a pulse in the $M_0$ signal (waveform C). As FIG. 8 indicates by a dashed line 801 and the "start of N" depicted in waveform A, N-divider 407 starts a new frequency-division cycle almost immediately after both N-divider 407 and M-divider 419 have each completed its preceding frequency-division cycle. Also, a dashed line 803 and the "start of M" depicted in waveform D indicates that M-divider 419 on a substantially simultaneous basis starts its new frequency-division cycle.

Phase error does not tend to accumulate in multimode synthesizer 401 because at least one of the N counter 501 and M counter 505 is delayed such that both the N counter 501 and M counter 505 recommence counting within a fixed interval of time with respect to one another, preferably approximately simultaneously.

There will now be described an example contrasting the operation of synthesizer 401 with the operation of prior art synthesizer 1 as summarized in Table 1 above. For this example, assume that synthesizer 401 has been operating such that N-divider 407 frequency-divides a 40 MHz REF CLK 403 by 40, and that M-divider 419 frequency-divides a 100 MHz TCLK 405 by 100. Assume at an instance in time referred to herein as time 0, a new start value is transferred to register 421 such that thereafter M-divider 419 will frequency-divide TCLK 405 by 128. Assume for simplicity also that the transfer function from the time error in nanoseconds between the end of the $N_0$ cycle and the end of the $M_0$ cycle) to the change in VCO frequency is a constant. This gain (0.5 Hz per nanosecond) is much higher than the gain (0.0037 Hz per nanosecond) involved in the example summarized in Table 1

Table 2 set forth below lists the following data for this example. One column lists the cycle number for N-divider 407. Another column lists the cycle number for M-divider 419. Another column lists elapsed time from time 0 for specific events, viz., the times at which N-divider 407 ends its frequency-division cycle, the times at which M-divider 419 ends its frequency-division cycle, and the approximate times at which ensuing frequency-division cycles start. Another column lists the frequency of VCO 417. Another column lists the error magnitude (the difference in time between the ends of the frequency-division cycles of N-divider 407 and M-divider 419. Another column lists the percentage error between the current and target frequencies of VCO 417.

TABLE 2

| N | M | ELAPSED TIME | VCO FREQ | ERROR | % |
|---|---|---|---|---|---|
| 1 |  |  |  |  |  |
|  | END N | 1000 | 100.00 |  | 22% |
|  | 1 END M | 1280 |  | 280 |  |
| 2 | START | 1330 |  |  |  |
|  | END N | 2330 | 114.00 |  | 11% |
|  | 2 END M | 2453 |  | 123 |  |
| 3 | START | 2503 |  |  |  |
|  | END N | 3503 | 120.14 |  | 6% |
|  | 3 END M | 3568 |  | 65 |  |
| 4 | START | 3618 |  |  |  |
|  | END N | 4618 | 123.41 |  | 4% |
|  | 4 END M | 4655 |  | 37 |  |
| 5 | START | 4705 |  |  |  |
|  | END N | 5705 | 125.27 |  | 2% |
|  | 5 END M | 5727 |  | 22 |  |
| 6 | START | 5777 |  |  |  |
|  | END N | 6777 | 126.36 |  | 1% |
|  | 6 END M | 6790 |  | 13 |  |

TABLE 2-continued

| N | M | ELAPSED TIME | VCO FREQ | ERROR | % |
|---|---|---|---|---|---|
| 7 | START | 6840 |  |  |  |
|  | END N | 7840 | 127.01 |  | 1% |
|  | 7 END M | 7848 |  | 8 |  |
| 8 | START | 7898 |  |  |  |
|  | END N | 8898 | 127.40 |  | 0% |
|  | 8 END M | 8903 |  | 5 |  |
| 9 | START | 8953 |  |  |  |
|  | END N | 9953 | 127.63 |  |  |
|  | 9 END M | 9956 |  | 3 |  |
| 10 | START | 10006 |  |  |  |
|  | END N | 11006 | 127.78 |  |  |
|  | 10 END M | 11007 |  | 2 |  |
| 11 | START | 11057 |  |  |  |
|  | END N | 12057 | 127.86 |  |  |
|  | 11 END M | 12058 |  | 1 |  |
| 12 | START | 12108 |  |  |  |
|  | END N | 13108 | 127.92 |  |  |
|  | 12 END M | 13109 |  | 1 |  |

As the first row of Table 2 indicates, at the end of the first frequency-division cycle of N-divider 407, VCO 417 continues operating at 100 MHz which constitutes an initial percentage error of 22%, measured against the target frequency of 128 MHz. Whereas the first frequency-division cycle of N-divider 407 ends after a total elapsed time of 1000 nanoseconds, the first frequency-division cycle of M-divider 419 ends after a total elapsed time of 1280 nanoseconds. The first measured error magnitude is 280 nanoseconds. Based on the assumed transfer function VCO 417 then operates at a higher frequency of 114 MHz.

Compared with Table 1 above, one significant difference that Table 2 indicates is that, during seek mode, N-divider 407 does not independently start each successive frequency-division cycle, but instead does so after M-divider 419 has also ended its frequency-division cycle. The third row of Table 2 shows that the start of the next frequency-division cycle occurs at an elapsed time of 1330 nanoseconds (this simplification ignores the minor difference in start time resulting from separate synchronizations by sync 513 and sync 517). In Table 2, the error magnitude decreases monotonically cycle to cycle from 280 nanoseconds to 127.40 nanoseconds by the end to the eighth frequency-division cycle. At this stage of operation, the error magnitude has been reduced to less than 1%.

Figure 9:
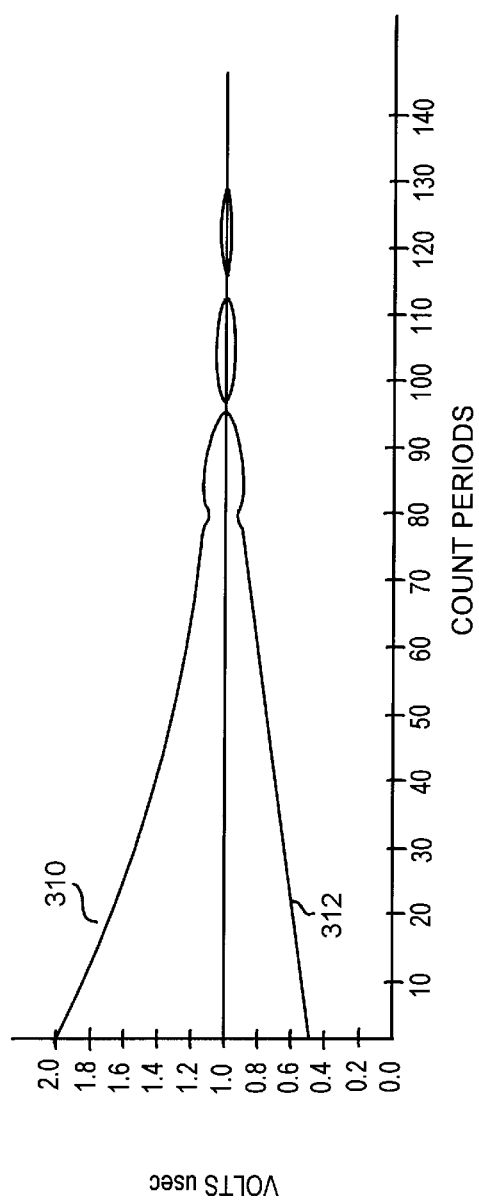
FIG. 9 is a simulated waveform showing capacitor voltage and VCO period plotted together for the prior art frequency synthesizer of FIG. 1 to illustrate its comparatively slow seek and settle time.

With reference to FIG. 9, decrease in capacitor voltage 310 and the consequent increase in the period 312 of the TCLK output signal 18 of the prior art frequency synthesizer takes approximately 95 count periods to stabilize.

Figure 10:
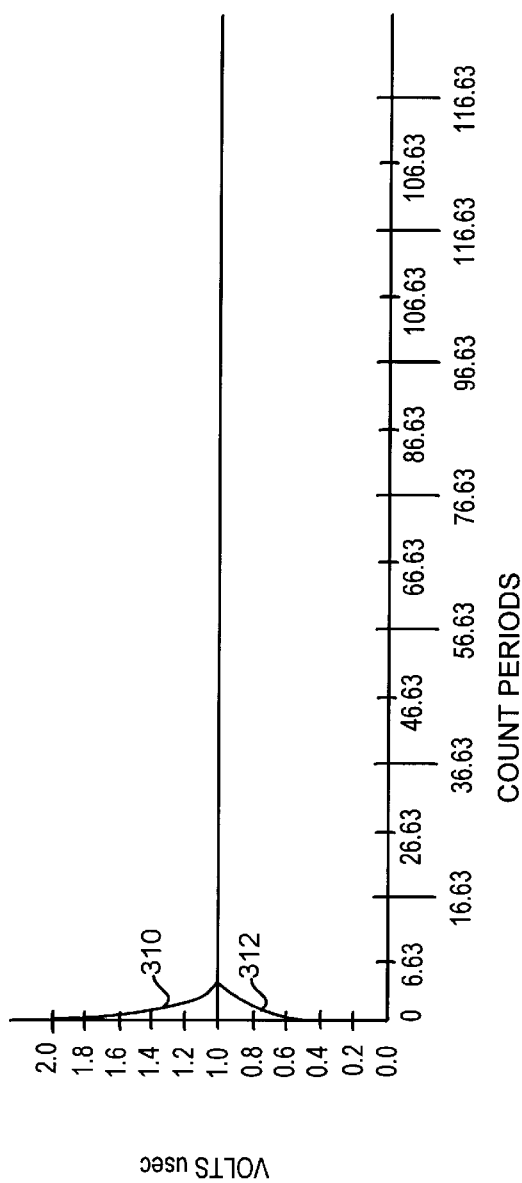
FIG. 10 is a simulated waveform showing capacitor voltage and VCO period plotted together for the multimode frequency synthesizer of FIG. 4 to illustrate its comparatively fast seek and settle time.
Figure 11:
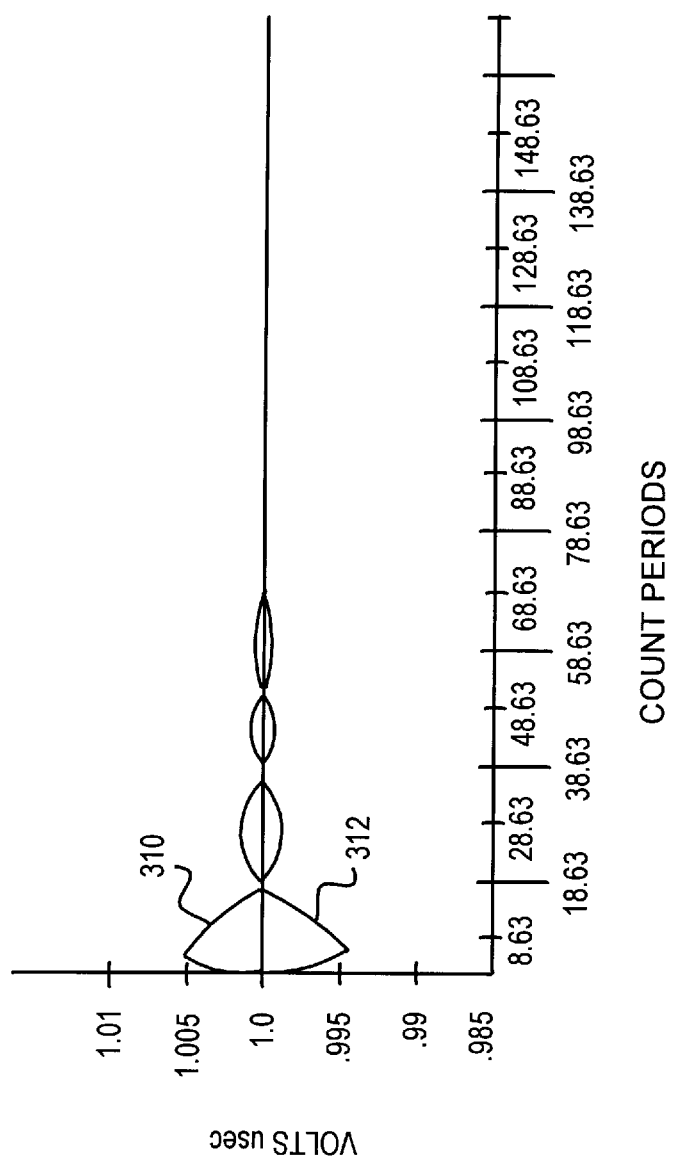
FIG. 11 is a simulated waveform of the capacitor voltage and VCO period of FIG. 10 with a substantially higher vertical resolution.

With reference to FIG. 10, only approximately three frequency-division cycles are required for stabilization of multimode synthesizer 401. FIG. 11 provides enhanced vertical resolution of the graph of FIG. 10.

We claim:

1. A frequency synthesizer responsive to a reference frequency signal and having multiple modes of operation including a relatively short-duration frequency seek mode and a relatively long-duration normal mode, the frequency synthesizer comprising:

an oscillator providing a periodic output signal having a frequency;

a feedforward state machine including a first register for storing a first start state and being responsive to the reference frequency signal to define a first counting cycle by counting from the first start state to a first end state;

a feedback state machine including a second register for storing a second start state and being responsive to the periodic output signal to define a second counting cycle by counting from the second start state to a second end state;

a phase comparator coupled to the feedfoward state machine and the feedback state machine;

controllable gain control means coupled between the phase comparator and the oscillator;

wherein the feedforward state machine further includes means responsive to the first end state of the first register for providing a first time-varying, binary-valued signal to the phase comparator; the feedback state machine further includes means responsive to the second end state of the second register for providing a second time-varying, binary-valued signal to the phase comparator; the controllable gain control means providing a control signal to the oscillator to control the frequency of the periodic output signal; the feedforward and feedback state machines defining the counting cycles independently of each other in the normal mode;

a logic circuitry coupled to the controllable gain control means, the feedforward state machine, and the feedback state machine for causing the frequency synthesizer to have a higher loop gain in the seek mode than in the normal mode, and for repeatedly coordinating the first and second counting cycles of the feedforward and the feedback state machines during the seek mode to cause the first and second registers repeatedly to begin counting from the first and second start states substantially simultaneously.

2. The frequency synthesizer as recited in claim 1, wherein the logic circuitry includes a logic gate responsive to the first and second time-varying, binary-valued signals to produce a control signal indicating a completion of the first and second counting cycles of the feedfoward and the feedback state machines.

3. The frequency synthesizer as recited in claim 1, wherein the logic circuitry comprises at least one synchronizer to cause the first and second registers to enter their start states approximately simultaneously.

4. The frequency synthesizer as recited in claim 1, wherein the logic circuitry comprises a first synchronizer to which the feedforward state machine is responsive and a second synchronizer to which the feedback state machine is responsive, the first and second synchronizers cooperating to cause the first and second registers to enter their start states approximately simultaneously.

5. The frequency synthesizer as recited in claim 1, wherein the oscillator comprises a voltage-controlled oscillator.

6. The frequency synthesizer as recited in claim 5, wherein the controllable gain control means comprises a charge pump and a filter.

7. The frequency synthesizer as recited in claim 1, and further comprising a bus and a programmable register coupled between the bus and the first register.

8. The frequency synthesizer as recited in claim 1, and further comprising a bus and a programmable register coupled between the bus and the second register.

9. The frequency synthesizer as recited in claim 1, wherein the logic circuitry includes a counting means for counting the duration of the seek mode.

10. The frequency synthesizer as recited in claim 9, wherein the counting means includes a cycle counter for counting predetermined number of cycles of the seek mode.

11. The frequency synthesizer as recited in claim 10, wherein the predetermined number of cycles is within the range between and including 6 and 8 counting cycles.

12. The frequency synthesizer as recited in claim 9, wherein the counting means includes an interval counter.

13. The frequency synthesizer as recited in claim 1, wherein the oscillator comprises a voltage-controlled oscillator and wherein the controllable gain control means includes a charge pump and a filter comprising a capacitor, the charge pump including multiple current sources and controllable switching means for selectively connecting the current sources to the capacitor.

14. The frequency synthesizer as recited in claim 5, wherein the controllable gain control means comprises a charge pump and a filter.

15. An integrated circuit for an embedded-servo disk drive that includes a microprocessor to supervise operations including writing and reading in accordance with a zone-banded format, the integrated circuit including a frequency synthesizer, a bus, and first and second registers for receiving respectively programmed first and second start values from the microprocessor, the frequency synthesizer receiving a reference frequency signal and having multiple modes of operation including a relatively short-duration frequency seek mode and a relatively long-duration normal mode, the frequency synthesizer comprising:

an oscillator providing a periodic output signal having a frequency;

a feedforward state machine including a first register for storing the first start state and being responsive to the reference frequency signal to define a first counting cycle by counting from the first start state to a first end state;

a feedback state machine including a second register for storing the second start state and being responsive to the periodic output signal to define a second counting cycle by counting from the second start state to a second end state;

a phase comparator coupled to the feedforward state machine and the feedback state machine;

controllable gain control means coupled between the phase comparator and the oscillator;

wherein the feedforward state machine further includes means responsive to the first end state of the first register for providing a first time-varying, binary-valued signal to the phase comparator; the feedback state machine further includes means responsive to the second end state of the second register for providing a second time-varying, binary-valued signal to the phase comparator, the controllable gain control means providing a control signal to the oscillator to control the frequency of the periodic output signal; the feedforward and feedback state machines defining the counting cycles independently of each other in the normal mode;

a logic circuitry coupled to the controllable gain control means, the feedforward state machine, and the feedback state machine for causing the frequency synthesizer to have a higher loop gain in the seek mode than in the normal mode, and for repeatedly coordinating the first and second counting cycles of the feedforward and the feedback state machines during the seek mode to cause the first and second registers repeatedly to begin counting from the first and second start states substantially simultaneously.

16. The frequency synthesizer as recited in claim 15, wherein the logic circuitry includes a logic gate responsive to the first and second time-varying, binary-valued signals to produce a control signal indicating a completion of the first and second counting cycles of the feedforward and the feedback state machines.

17. The frequency synthesizer as recited in claim 15, wherein the logic circuitry comprises at least one synchronizer to cause the first and second registers to enter their start states approximately simultaneously.

18. The frequency synthesizer as recited in claim 15, wherein the logic circuitry comprises a first synchronizer to which the feedforward state machine is responsive and a second synchronizer to which the feedback state machine is responsive, the first and second synchronizers cooperating to cause the first and second registers to enter their start states approximately simultaneously.

19. The frequency synthesizer as recited in claim 15, wherein the oscillator comprises a voltage-controlled oscillator.

20. The frequency synthesizer as recited in claim 15, and further comprising a bus and a programmable register coupled between the bus and the first register.

21. The frequency synthesizer as recited in claim 15, and further comprising a bus and a programmable register coupled between the bus and the second register.

22. The frequency synthesizer as recited in claim 15, wherein the logic circuitry includes a counting means for counting the duration of the seek mode.

23. The frequency synthesizer as recited in claim 22, wherein the counting means includes a cycle counter for counting predetermined number of cycles of the seek mode.

24. The frequency synthesizer as recited in claim 23, wherein the predetermined number of cycles is within the range between and including 6 and 8 counting cycles.

25. The frequency synthesizer as recited in claim 22, wherein the counting means includes an interval counter.

26. The frequency synthesizer as recited in claim 15, wherein the oscillator comprises a voltage-controlled oscillator and wherein the controllable gain control means includes a charge pump and a filter comprising a capacitor, the charge pump including multiple current sources and controllable switching means for selectively connecting the current sources to the capacitor.

* * * * *